United States Patent
Bhaumik et al.

(10) Patent No.: US 11,067,954 B1
(45) Date of Patent: Jul. 20, 2021

(54) TIME-TO-DIGITAL CONVERTERS WITH LOW AREA AND LOW POWER CONSUMPTION

(71) Applicant: Analog Devices International Unlimited Company, Limerick (IE)

(72) Inventors: Wreeju Bhaumik, Bangalore (IN); Batna Suryanarayana, Andhra Pradesh (IN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/930,120

(22) Filed: Jul. 15, 2020

(51) Int. Cl.
- *H03M 1/12* (2006.01)
- *G04F 10/00* (2006.01)
- *H03L 7/099* (2006.01)
- *H03L 7/08* (2006.01)

(52) U.S. Cl.
CPC .......... *G04F 10/005* (2013.01); *H03L 7/0802* (2013.01); *H03L 7/0995* (2013.01)

(58) Field of Classification Search
CPC .............................. G04F 10/005; H03L 7/0802
USPC ......................................... 341/155, 166, 156
See application file for complete search history.

(56) References Cited

U.S. PATENT DOCUMENTS

| | | | |
|---|---|---|---|
| 7,332,973 B2 * | 2/2008 | Lee | G04F 10/005 327/12 |
| 8,138,843 B2 | 3/2012 | Straayer et al. | |
| 9,092,013 B2 * | 7/2015 | Song | G04F 10/005 |
| 9,270,288 B2 | 2/2016 | Perrott | |
| 9,455,667 B2 | 9/2016 | Vlachogiannakis et al. | |
| 10,191,453 B2 | 1/2019 | Pavlovic et al. | |

OTHER PUBLICATIONS

Jiang et al., *Successive Approximation Time-to-Digital Converter with Vernier-level Resolution*, 21st IEEE International Mixed-Signal Testing Workshop, Catalunya, Spain, Jul. 4, 2016, 73 pages.
Chen et al., *A Low Power High Accuracy CMOS Time-to-Digital Converter*, 1997 IEEE International Symposium on Circuits and Systems, Jun. 9-12, 1997, Hong Kong, 4 pages.
Rivoir, *Fully-Digital Time-to-Digital for ATE with Autonomous Calibration*, International Test Conference, 1-4244-0292-1/06 © 2006 IEEE, 10 pages.

(Continued)

*Primary Examiner* — Peguy Jean Pierre
(74) *Attorney, Agent, or Firm* — Patent Capital Group

(57) ABSTRACT

TDCs for converting time periods to digital values are disclosed. An example TDC includes a ring oscillator and a residue generation circuit. Each stage of the residue generation circuit is configured to operate on outputs from two different stages of the ring oscillator. The TDC further includes a counter for counting the number of times that an output of one of the stages of the ring oscillator switches between being at a first signal level and being at a second signal level during a time period that is being converted to a digital value. The TDC also includes a combiner for generating the digital value by combining a value indicative of the number of times counted by the counter and an output of the residue generation circuit. Such a TDC may have relatively low area and low power consumption compared to the conventional TDC designs, while yielding sufficiently linear behavior.

26 Claims, 7 Drawing Sheets

(56) References Cited

OTHER PUBLICATIONS

Straayer et al., *A Multi-Path Gated Ring Oscillator TDC with First-Order Noise Shaping*, IEEE Journal of Solid-State Circuits, vol. 44, No. 4, Apr. 2009, 10 pages.
Nissinen et al., *A CMOS Time-to-Digital Converter based on a Ring Oscillator for a Laser Radar*, 0-7803-8108-4 © 2003 IEEE, 4 pages.
ADSP-21566/21567/21569, SHARC+Single Core High Performance DSP (Up to 1 GHz), Analog Devices, © 2020, 98 pages.
Mäntyniemi et al., *A 9-channel Integrated Time-to-Digital Converter With Sub-nanosecond Resolution*, 0-7803-3694-1/97 © 1997, 4 pages.
Rezvanyvardom et al., *A Novel Cyclic Time-to-Digital Converter Based on Triple-Slope Interpolation and Time Amplification*, DOI: 10.13164/re.2015.0800, 8 pages.
Nissinen, *CMOS Time-to-Digital Converter Structures for the Integrated Receiver of a Pulsed Time-of-Flight Laser Rangefinder*, OULU 2011, 100 pages.
Tancock et al., *A Review of New Time-to-Digital Conversion Techniques*, IEEE Transactions on Instrumentation and Measurement, vol. 68, No. 10, Oct. 2019, 12 pages.

\* cited by examiner

TIME-TO-DIGITAL CONVERTERS WITH LOW AREA AND LOW POWER CONSUMPTION

TECHNICAL FIELD OF THE DISCLOSURE

The present disclosure generally relates to electronic devices and systems and, more particularly, to time-to-digital converters.

BACKGROUND

In electronic instrumentation and signal processing, a time-to-digital converter (TDC) is a device for recognizing events and providing a digital representation of the time when they occurred or a time period over which they occurred. For example, a TDC might output digital values indicative of the time of arrival for each incoming pulse. Some applications wish to measure the time interval between two events rather than some notion of an absolute time. For example, a TDC used in a phase-locked loop (PLL) circuit may measure a phase difference between an input clock signal and a feedback clock signal. The TDC may digitize the phase difference between a pulse of the input clock signal and a pulse of the feedback clock signal, and output an indication of the digitized phase difference.

A variety of factors can affect the cost, quality and robustness of a TDC. Physical constraints such as space/surface area can pose further constraints to the TDC requirements or specifications, and thus trade-off and ingenuity have to be exercised in designing a TDC that is optimal for a given application.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
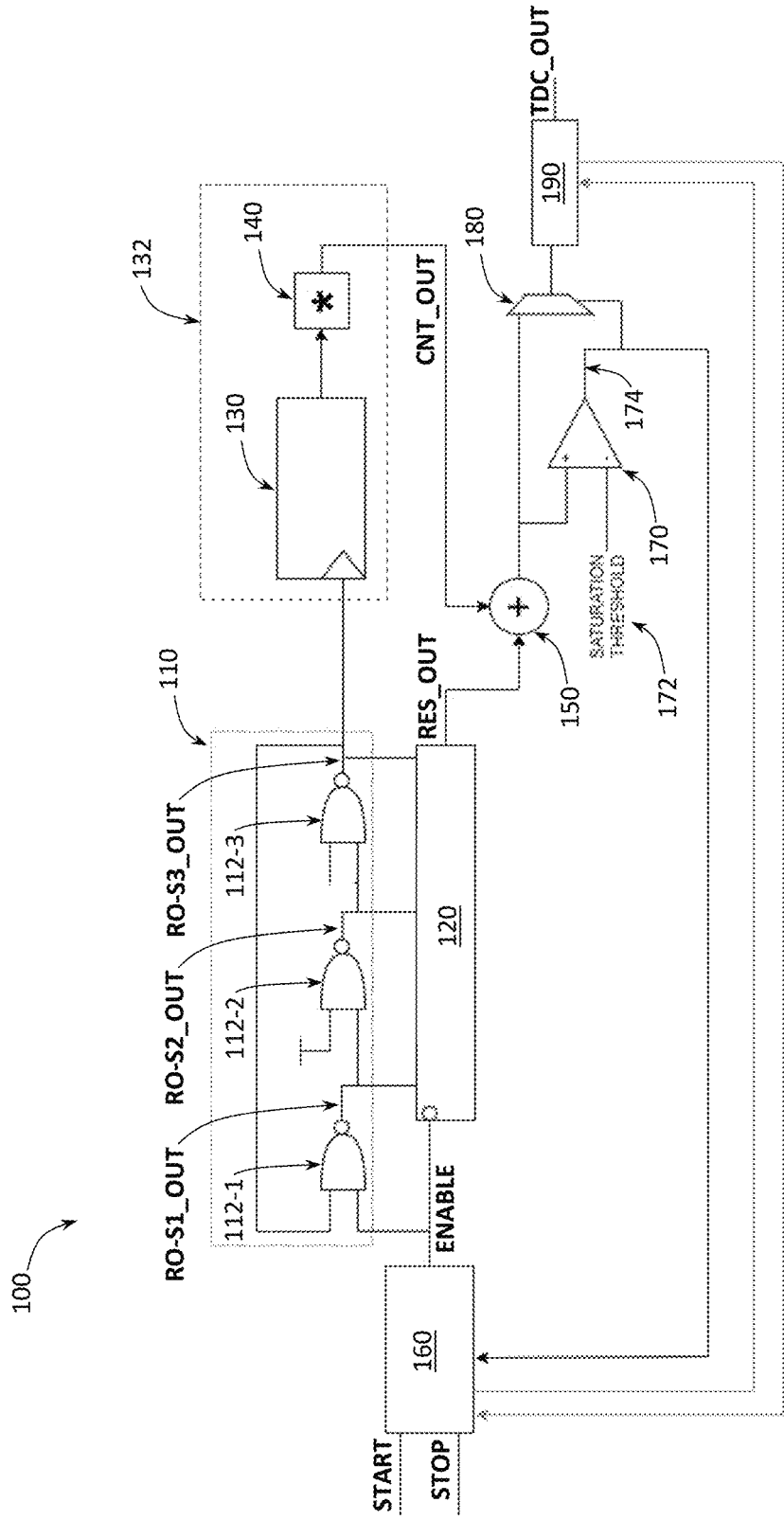
FIG. 1 provides an electric circuit diagram of an example TDC, according to some embodiments of the present disclosure.

The systems, methods and devices of this disclosure each have several innovative aspects, no single one of which is solely responsible for all of the desirable attributes disclosed herein. Details of one or more implementations of the subject matter described in the present disclosure are set forth in the description below and the accompanying drawings.

For purposes of illustrating TDCs with low area and low power consumption, proposed herein, it might be useful to first understand phenomena that may come into play in such devices. The following foundational information may be viewed as a basis from which the present disclosure may be properly explained. Such information is offered for purposes of explanation only and, accordingly, should not be construed in any way to limit the broad scope of the present disclosure and its potential applications.

As is the case with many electronic devices, die area occupied by a TDC and power consumed by a TDC during operation are two critical design parameters. Linearity of a TDC is another critical design parameter. Linearity of an electronic device (or an electronic component or a system) is easy to understand in theory. Namely, linearity generally refers to the ability of a device to provide an output signal that is directly proportional to an input signal. In other words, if a device is perfectly linear, the relationship of a ratio of the output signal to the input signal is a straight line. Achieving this behavior in real-life devices is far more complicated and many challenges to linearity must be resolved, often at the expense of some other design parameter, such as the die area or power consumption.

Many types of TDCs have been explored in the past, such as delay chain TDCs and cyclic TDCs. Conventional delay chain TDCs may provide the simplest implementation but have the disadvantages of having poor linearity and occupying a relatively large surface area on a die in order to realize the required range. Conventional cyclic TDCs may advantageously realize better linearity and occupy smaller surface area compared to the delay chain TDCs but require power-hungry circuitry.

Embodiments of the present disclosure relate to TDCs for converting time periods to digital values, and to devices and systems in which such TDCs may be implemented. An example TDC includes a ring oscillator and a residue generation circuit, each of which includes the same number of stages (i.e., the ring oscillator includes a plurality of stages and the residue generation circuit also includes a plurality of stages, equal in number to the number of stages of the ring oscillator). Each stage of the residue generation circuit is configured to operate on outputs from two different stages of the ring oscillator. The TDC further includes a counter, configured to count a number of times (e.g., by incrementing the counter value by 1 starting from a certain starting value, e.g., starting from 0) that a signal at an output of one of the plurality of stages of the ring oscillator switches between being at a first signal level (e.g., a voltage level corresponding to a high logic state) and being at a second signal level (e.g., a voltage level corresponding to a low logic state) during a given time period that is being converted to a digital value. For example, the counter may be configured to count the number of times that the output of that one stage of the ring oscillator switches from 0 to 1 and from 1 to 0 during the time period that an ENABLE signal for the ring oscillator and the residue generation circuit is in a first logic state (e.g., a high logic state). The TDC further includes a combiner, configured to generate the digital value representative of the time period being converted by combining a value indicative of the number of times counted by the counter and an output of the residue generation circuit (e.g., when the ENABLE signal for the ring oscillator and the residue generation circuit switches to a second logic state (e.g., a low logic state)). In such a TDC, the counter may be configured to operate on only one of the ring oscillator outputs (e.g., on the output of the last stage of the ring oscillator as shown in the present drawings, although in other embodiments the counter may operate on an output of any other stage of the ring oscillator), which advantageously allows keeping the total size and number of the counters relatively small, while the residue generation circuit may be used to provide a code corresponding to the state of the ring oscillator as the enable signal for the ring oscillator and the residue generation circuit switches to the second logic state. As a result, such a TDC may be realized with relatively low area and low power consumption compared to the conventional TDC designs, while yielding sufficiently linear behavior. For this reason, TDCs described herein may be referred to as "TDCs with relatively low area and power consumption" although this relative designation may change as technology develops further.

Some TDCs that utilize residue generation are known in the art. However, their principle of operation is drastically different from the TDCs proposed herein. For example, as will be described in greater detail below, the TDCs described herein are reset every time after a conversion of a time period to a digital value is finished. The duration between the start of a time period that the TDC needs to convert to a digital value, to the start of the next corresponding time period may be referred to as a "TDC cycle." Therefore, TDCs described herein are single-cycle TDCs in that the ring oscillator and the residue generation circuit are reset after each conversion is finished and before the next conversion begins. This is different from gated ring oscillator (GRO) TDC architectures where the residue from one TDC cycle is carried over to the next and results are averaged or filtered across TDC cycles. In another form of residue computation of a MASH TDC, the output of the ring oscillator is also computed over multiple TDC cycles and may be differentiated over two or more clock cycles within the TDC cycle to detect state transitions. This is also different from the TDCs described herein where no separate clock is needed to compute the residue and the residue computation is done over a single TDC cycle.

As will be appreciated by one skilled in the art, aspects of the present disclosure, in particular aspects of TDCs with relatively low area and power consumption as proposed herein, may be embodied in various manners—e.g., as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g., one or more microprocessors of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g., to the existing PLLs, digital signal processing (DSP) cores, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples.

In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. In general, while some drawings provided herein illustrate various aspects of TDCs with relatively low area and power consumption, and systems in which such circuits may be implemented, details of these systems may be different in different embodiments. For example, various components of TDCs with relatively low area and power consumption, presented herein, may have further components included therein, or coupled thereto, which are not specifically shown in the drawings, such as logic, storage, passive elements (e.g., resistors, capacitors, inductors, etc.), or other elements (e.g., transistors, etc.). In another example, details shown in some of the drawings, such as the particular arrangement and example implementation details of various components of TDCs presented herein (e.g., a ring oscillator, a residue generation circuit, etc.), the particular arrangement of coupling connections between the outputs of various stages of a ring oscillator and logic elements of a residue generation circuit, etc., may be different in different embodiments, with the illustrations of the present drawings providing only some examples of how these components may be used together to realize TDCs with relatively low area and power consumption. In yet another example, although some embodiments shown in the present drawings illustrate a certain number of components (e.g., a certain number of stages of a ring oscillator of a TDC, or a certain number of TDCs in a PLL circuit), it is understood that these embodiments may be implemented in a TDC or in any other devices or systems with any number of these components in accordance with the descriptions provided herein. Furthermore, although certain elements such as various elements of a ring oscillator and various elements of a residue generation circuit may be depicted in the drawings as communicatively coupled using a single depicted line, in some embodiments, any of these elements may be coupled by a plurality of conductive lines such as those that may be present in a bus, or when differential signals are involved.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., a TDC circuit may be referred to simply as a "TDC," etc.). If used, the terms "substantially," "approximately," "about," etc., may be used to generally refer to being within +/−20% of a target value, e.g., within +/−10% of a target value, based on the context of a particular value as described herein or as known in the art.

Example TDC

FIG. 1 provides an electric circuit diagram of an example TDC 100 that may be implemented with relatively low area and power, according to some embodiments of the present disclosure. As shown in FIG. 1, the TDC 100 may include a ring oscillator 110, a residue generation circuit 120, a counter 130, a multiplier 140, and a combiner 150.

The ring oscillator 110 may be implemented as any ring oscillator known in the art, having any number of 2 or more stages. FIG. 1 illustrates an example where the ring oscillator 110 has 3 stages, labeled as a first stage 112-1, a second stage 112-2, and a third stage 112-3, but in other embodiments of the TDC 100 another number of 2 or more stages may be used. In some embodiments, the ring oscillator 110 may include an odd number of 3 or more stages 112 (e.g., if the stages 112 of the ring oscillator are coupled to one another using single-ended connections, as shown in the example of FIG. 1). In other embodiments, the ring oscillator 110 may include an even number of 2 or more stages 112 (e.g., if the stages 112 of the ring oscillator 110 are coupled using differential connections). As shown in FIG. 1, each stage 112 of the ring oscillator 110 may include a respective (i.e., a different instance of) logic circuit having a response of a NOT gate (in other words, each stage 112 of the ring oscillator 110 may include/be a digital inverter). Respective outputs from various stages 112 are labeled in FIG. 1 as an output RO-S1_OUT from the stage 112-1, an output RO-S2_OUT from the stage 112-2, and an output RO-S3_OUT from the stage 112-3. These outputs are also shown in the timing diagram of FIG. 4, described below.

As shown in FIG. 1, in some embodiments, the output from the last stage of the ring oscillator 110, e.g., the output RO-S3_OUT from the stage 112-3 for the 3-stage ring oscillator example shown in FIG. 1, may be provided to the counter 130. However, in other embodiments of the TDC 100, the counter 130 may be coupled to any other stage 112 of the ring oscillator 110. The inputs and outputs of various stages 112 of the ring oscillator 110 may be coupled as known in the art. For example, the output RO-S1_OUT from the first stage 112-1 may be coupled to the input of the second stage 112-2, the output RO-S2_OUT from the second stage 112-2 may be coupled to the input of the third stage 112-3, and so on until the output from the last stage 112 may be coupled to the input of the first stage 112, thus forming a feedback loop. For the 3-stage ring oscillator example shown in FIG. 1, the latter means that the output RO-S3_OUT from the third (i.e., last) stage 112-3 may be coupled to the input of the first stage 112-1. As also shown in FIG. 1, in some embodiments, the first stage 112-1 of the ring oscillator 110 may be configured to receive an ENABLE signal. The ENABLE signal may be a control signal configured to activate the ring oscillator 110 (i.e., cause the ring oscillator 110 to oscillate), or de-activate the ring oscillator 110 (i.e., cause the ring oscillator 110 to stop oscillating).

The ring oscillator 110 may be associated with a certain initial or reset state from which oscillations of the ring oscillator 110 begin when a conversion of a new time period to a digital value begins. For the 3-stage ring oscillator 110 such a reset state may be 101, meaning that each of the output RO-S1_OUT and the output RO-S3_OUT has a voltage level corresponding to a high logic state (e.g., corresponding to the digital bit 1), the output RO-S2_OUT has a voltage level corresponding to a low logic state (e.g., corresponding to the digital bit 0). In the following, for simplicity, some control signals (e.g., the ENABLE signal, the START signal, or the STOP signal shown in FIG. 1 and in the timing diagram of FIG. 4) and output signals of some components (e.g., outputs RO-S1_OUT, RO-S2_OUT, and RO-S3_OUT of the stages 112) may be described with reference to a signal having a bit value of 1 or a bit value of 0. However, these descriptions may easily be extended to more general embodiments where a given signal may either have a certain first signal level (e.g., a voltage level) corresponding to a first state (e.g., a high logic state) or a certain second signal level (e.g., a voltage level) corresponding to a second state (e.g., a low logic state). In this context, the term "toggle" may be used to describe the change in the digital value of a signal from 0 to 1 or from 1 to 0 (or, equivalently, the change in the digital value from some first level to some second level, different from the first level, or the other way around). During operation, the outputs of various stages 112 of the ring oscillator 110 sequentially toggle between 1 and 0 values. Further details of operating the ring oscillator 110 are described with reference to the timing diagram of FIG. 4.

Figure 2:
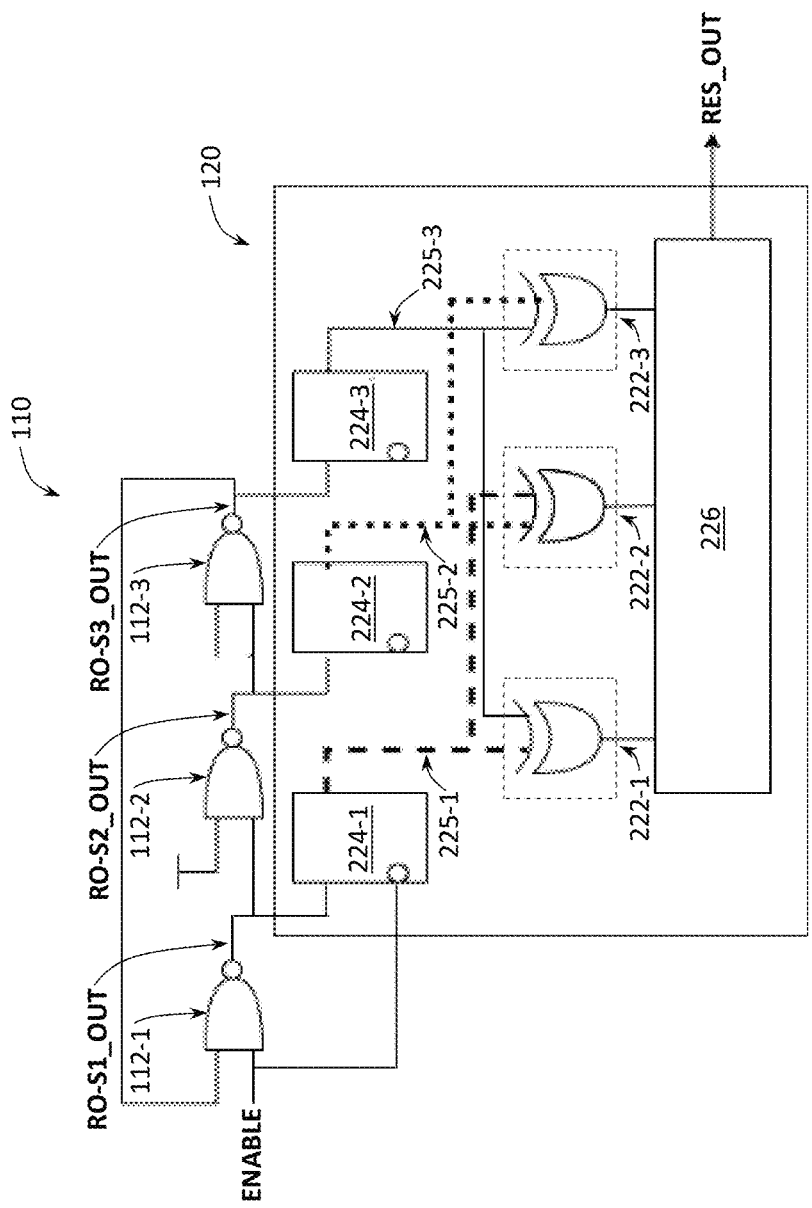
FIG. 2 provides an electric circuit diagram of a ring oscillator and a residue generation circuit of the TDC of FIG. 1, according to some embodiments of the present disclosure.

Example implementation of the residue generation circuit 120 is shown in FIG. 2. FIG. 2 illustrates the ring oscillator 110 and the input and output signals from the residue generation circuit 120 as shown in FIG. 1. In addition, FIG. 2 illustrates that the residue generation circuit 120 may also include a plurality of stages, e.g., 3 stages 222-1, 222-2, and 222-3 as shown in FIG. 2. In general, the number of stages 222 of the residue generation circuit 120 may be equal to the number of stages 112 of the ring oscillator 110. Thus, each stage 112 of the ring oscillator 110 may be associated with a corresponding stage 222 of the residue generation circuit 120 (i.e., the stage 112-1 of the ring oscillator 110 may be associated with the stage 222-1 of the residue generation circuit 120, the stage 112-2 of the ring oscillator 110 may be associated with the stage 222-2 of the residue generation circuit 120, and so on). As also shown in FIG. 2, the TDC 100 may further include a plurality of latch circuits (or flip-flops) 224, where the number of latch circuits 224 may be equal to the number of stages of the ring oscillator 110. Thus, each stage 112 of the ring oscillator 110 and each stage 222 of the residue generation circuit 120 may be associated with a corresponding one of the latch circuits 224 (i.e., the stage 112-1 of the ring oscillator 110 and the stage 222-1 of the residue generation circuit 120 may be associated with the latch circuit 224-1, the stage 112-2 of the ring oscillator 110 and the stage 222-2 of the residue generation circuit 120 may be associated with the latch circuit 224-2, and so on). In some embodiments, the latch circuits 224 may be considered to be a part of the residue generation circuit 120.

The residue generation circuit 120 is configured to generate an output RES_OUT by being configured as follows. The residue generation circuit 120 may be configured to receive the ENABLE signal that is also provided to the ring oscillator 110. In particular, at least one of the latch circuits 224 (e.g., each of the latch circuits 224) may have a further input configured to receive the ENABLE signal, configured to enable the residue generation circuit 120 to generate an output RES_OUT once the time period being converted to a digital value has ended and before the residue generation circuit 120 is reset for a conversion of another time period. For example, the first latch circuit 224-1 may be configured to receive the ENABLE signal, as shown in FIG. 2. The ENABLE signal may be a control signal configured to activate the residue generation circuit 120, eventually causing the residue generation circuit 120 to generate the residue output signal, RES_OUT, or de-activate the residue generation circuit 120 (i.e., cause the residue generation circuit 120 to not generate the residue output). As shown in FIG. 2, the first latch circuit 224-1 may be configured to receive the output RO-S1_OUT from the first stage 112-1 of the ring oscillator 110, and provide an output 225-1 to each of the first stage 222-1 and the second stage 222-2 of the residue generation circuit 120. Similarly, the second latch circuit 224-2 may be configured to receive the output RO-S2_OUT from the second stage 112-2 of the ring oscillator 110, and provide an output 225-2 to each of the second stage 222-2 and the third stage 222-3 of the residue generation circuit 120. For the 3-stage ring oscillator example of the TDC 100, the third latch circuit 224-3 (which is the last latch circuit in this example) may be configured to receive the output RO-S3_OUT from the third stage 112-3 (i.e., the last stage in this example) of the ring oscillator 110, and provide an output 225-3 to each of the third stage 222-3 and the first stage 222-1 of the residue generation circuit 120. In general, for other number of stages includes in the ring oscillator 110 of the TDC 100, each latch circuit 224 except for the one associated with the last stage of the ring oscillator 110 is configured to receive an output of the corresponding stage of the ring oscillator 110 and provide an output 225 to the stage of the residue generation circuit 120 associated with the corresponding stage of the ring oscillator 110 as well as to the stage of the residue generation circuit 120 associated with the next stage of the ring oscillator 110. The last latch circuit 224 is configured to receive an output of the last stage of the ring oscillator 110 and provide an output 225 to the last as well as to the first stage of the residue generation circuit 120. In this manner, various stages 222 of the residue generation circuit 120 are coupled to the outputs of various stages 112 of the ring oscillator 110. In particular, each stage 222 of the residue generation circuit 120 is configured to operate on two inputs: the first stage 222-1 of the residue generation circuit 120 is configured to operate on the output RO-S1_OUT of the first stage 112-1 of the ring oscillator 110 and the output of the last stage of the ring oscillator 110 (i.e., the output RO-S3_OUT of the third stage 112-3 of the ring oscillator 110 for the 3-stage example shown in FIGS. 1 and 2), the second stage 222-2 of the residue generation circuit 120 is configured to operate on the output RO-S1_OUT of the first stage 112-1 of the ring oscillator 110 and the output RO-S2_OUT of the second stage 112-2 of the ring oscillator 110, and the last stage 222-3 of the residue generation circuit 120 (for the 3-stage example of FIGS. 1 and 2) is configured to operate on the output RO-S2_OUT of the second stage 112-2 of the ring oscillator 110 and the output RO-S3_OUT of the last stage 112-3 of the ring oscillator 110. In some embodiments, each stage 222 of the residue generation circuit 120 may include a respective (i.e., a different instance of) logic circuit having a response of an exclusive OR (XOR) gate, as shown in FIG. 2.

FIG. 2 further illustrates that the residue generation circuit 120 may further include an encoder 226, configured to combine the outputs from the plurality of stages 222 of the residue generation circuit 120 to generate the output RES_OUT indicative of the residue computed by the residue generation circuit 120. After the ENABLE signal has switched to the second logic state, or become inactive, a combination of the XOR stages 222 of the residue generation circuit 120 and the encoder 226 (scaled by the number of stages 112 of the ring oscillator 110) may provide a residue (i.e., the output RES_OUT) that is added to the multiplied counter value to get the final TDC output, TDC_OUT. Further details of operating the residue generation circuit 120 are described with reference to the timing diagram of FIG. 4.

Continuing again with the components of the TDC 100 illustrates in FIG. 1, the counter 130 may be coupled to an output of one of the plurality of stages 112 of the ring oscillator 110. For example, FIG. 1 illustrates that, in some embodiments, the counter 130 may be coupled to the output RO-S3_OUT of the last stage 112-3 of the ring oscillator 110. However, in other embodiments, the counter 130 may be coupled to the output of any one of the other stages 112 of the ring oscillator 110. The counter 130 is configured to count a number of times that a signal at the output of the one of the plurality of stages 112 to which the counter 130 is coupled switches between being at a first signal level (e.g., a voltage level corresponding to a high logic state) and being at a second signal level (e.g., a voltage level corresponding to a low logic state) (e.g., the counter 130 counts the number of times the output of that stage of the ring oscillator switches from 0 to 1 or from 1 to 0) during a time period that is being converted to a digital value (e.g., during the time period that the ENABLE signal for the ring oscillator 110 and the residue generation circuit 120 is in a first logic state (e.g., a high logic state)). For the example shown in FIG. 1, the counter 130 is configured to count the number of times that the output signal RO-S3_OUT toggles. The multiplier 140 may then be configured to multiply the counter value of the counter 130 by the total number of stages 112 of the ring oscillator 110 (e.g., multiply by 3 for the 3-stage example shown in FIG. 1), thus generating a counter signal CNT_OUT. The combiner 150 is then configured to combine a value indicative of the number of times counted by the counter 130 and an output of the residue generation circuit 120 (e.g., when the ENABLE signal for the ring oscillator 110 and the residue generation circuit 120 switches to a second logic state (e.g., a low logic state)) to generate a digital value representative of the time period being converted by the TDC 100. For example, the combiner 150 may be configured to combine the value of the counter signal CNT_OUT and the residue output RES_OUT to generate a digital value representative of the time period being converted by the TDC 100.

As the foregoing description illustrates, in the TDC 100, there is only one counter 130 that is configured to operate on an output of only one of the stages 112 of the ring oscillator 110 (e.g., on the output RO-S3_OUT of the last stage of the ring oscillator 110 as shown in the present drawings although in other embodiments the counter 130 may operate on an output of any other ring oscillator stages 112). This may advantageously reduce the requirement of multiple counters each operating on a single ring oscillator output or a single counter operating on multiple ring oscillator outputs and allow keeping the size of the TDC relatively small, while using counter 130 and the residue generation circuit 120 to provide a code corresponding to the state of the ring oscillator 110 as the ENABLE signal for the ring oscillator 110 and the residue generation circuit 120 switches to the second logic state.

Figure 3:
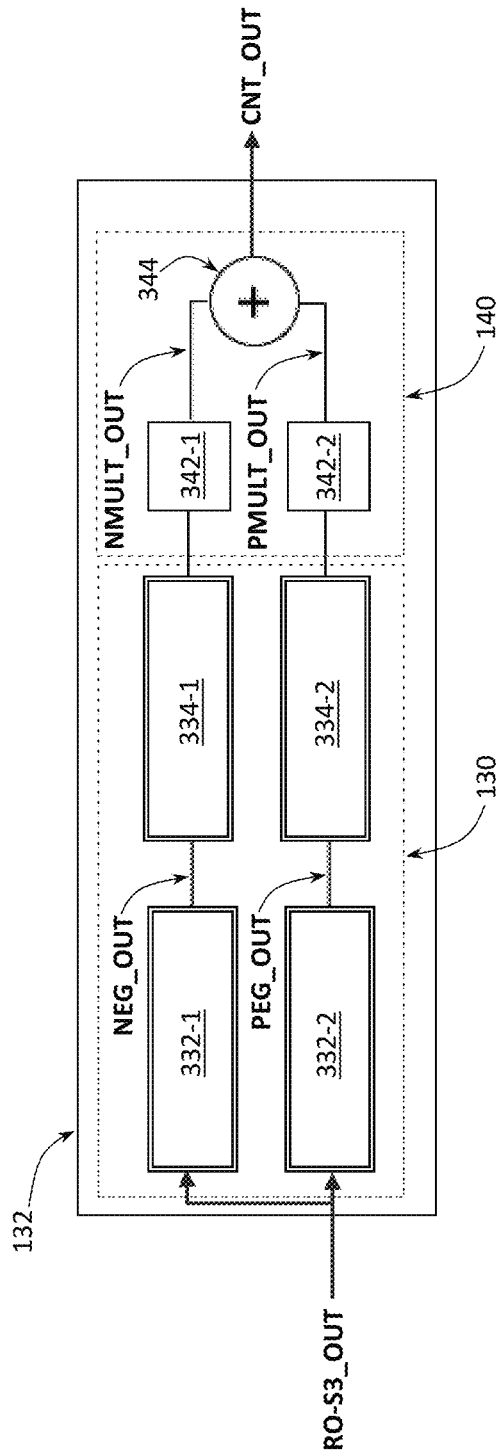
FIG. 3 provides a schematic illustration of a counter that may be used in the TDC of FIG. 1, according to some embodiments of the present disclosure.

In some embodiments, the counter 130 and the multiplier 140 together may form what may be referred to as a counter arrangement 132, configured to receive an output of one of the stages 112 of the ring oscillator 110 and generate the counter signal CNT_OUT indicative of how many times that output toggles during the time period being converted to digital. In some embodiments, the counter arrangement 132 may be implemented as shown in FIG. 3. The counter 130 of the counter arrangement 132 may include a first edge generator circuit 332-1 followed by a first edge counter 334-1, and further include a second edge generator circuit 332-2 followed by a second edge counter 334-2. As shown in FIG. 3, the input received by the counter 130, e.g., the output RO-S3_OUT of the last stage of the ring oscillator 110 for the example shown in FIG. 1, may be provided as an input to each of the first edge generator circuit 332-1 and the second edge generator circuit 332-2.

The first edge generator circuit 332-1 may be configured to generate a first indication when the signal at the output of the one of the stages 112 to which the counter 130 is coupled (e.g., of the output RO-S3_OUT) switches from being at the first signal level (e.g., a voltage level corresponding to a high logic state) to being at the second signal level (e.g., a voltage level corresponding to a low logic state). For example, the first edge generator circuit 332-1 may be configured to generate a first indication when the output RO-S3_OUT toggles from 1 to 0. The first edge generator circuit 332-1 may be configured to provide its' output, NEG_OUT, to the first edge counter 334-1 that may be configured to count the number of times the first edge generator circuit 332-1 generated said indication of a toggle from 1 to 0. For example, said indication may be provided as a different signal level in the output NEG_OUT generated by the first edge generator circuit 332-1 (e.g., as a pulse in the output NEG_OUT, as shown in the timing diagram of FIG. 4).

Analogously, the second edge generator circuit 332-2 may be configured to generate a second indication when the signal at the output of the one of the stages 112 to which the counter 130 is coupled (e.g., of the output RO-S3_OUT) switches from being at the second signal level (e.g., a voltage level corresponding to a low logic state) to being at the first signal level (e.g., a voltage level corresponding to a high logic state). For example, the second edge generator circuit 332-2 may be configured to generate a second indication when the output RO-S3_OUT toggles from 0 to 1. The second edge generator circuit 332-2 may be configured to provide its' output, PEG_OUT, to the second edge counter 334-2 that may be configured to count the number of times the second edge generator circuit 332-2 generated said indication of a toggle from 0 to 1. For example, said indication may be provided as a different signal level in the output PEG_OUT generated by the second edge generator circuit 332-2 (e.g., as a pulse in the output PEG_OUT, as shown in the timing diagram of FIG. 4).

The value of the counter 130 may then be (or may be based on) a sum of a number of times the first edge generator circuit 332-1 generated the first indication and a number of times the second edge generator circuit 332-2 generated the second indication during the time period that is being converted to the digital value. Thus, the counter 130 may be a dual-edge counter that counts both switches in the output value of one of the stages 112 from 1 to 0 and switches in the output value of one of the stages 112 from 0 to 1.

The multiplier 140 of the counter arrangement 132 may include a first multiplier 342-1, configured to receive an input indicative of the output of the first edge counter 334-1, and further include a second multiplier 342-2, configured to receive an input indicative of the output of the second edge counter 334-2. The first multiplier 342-1 may be configured to generate a first multiplier output, NMULT_OUT, by multiplying a value indicative of (e.g., equal to) the number of stages 112 of the ring oscillator 110 and the counter value of the first edge counter 334-1. Similarly, the second multiplier 342-2 may be configured to generate a second multiplier output, PMULT_OUT, by multiplying the value indicative of (e.g., equal to) the number of stages 112 of the ring oscillator 110 and the counter value of the second edge counter 334-2. As further shown in FIG. 3, the multiplier 140 of the counter arrangement 132 may further include a combiner (e.g., an adder) 344, configured to generate an adder output by adding the output NMULT_OUT of the first multiplier 342-1 and the output PMULT_OUT of the second multiplier 342-2. The output from the counter arrangement 132, CNT_OUT, may then be a value based (e.g., is equal to) on the output of the adder 344. Thus, TDC 100 may use the counter 130 that is a dual-edge counter, and the multiplier 140 that can multiply the total value of the counter 130 by the number of stages 112 of the ring oscillator 110. In some embodiments, the multipliers 342-1 and 342-2 and the residue generation circuit 120 may be configured to operate only after the time period that is being converted to digital has ended (e.g., after the ENABLE signal has switched to the second logic state, or become inactive). Separating each of the counter 130 and the multiplier 140 into components that operate on the negative edge (e.g., the edge generator circuit 332-1, the edge counter 334-1, and the multiplier 342-1, operating on the output RO-S3_OUT switching from 1 to 0) and components that operate on the positive edge (e.g., the edge generator circuit 332-2, the edge counter 334-2, and the multiplier 342-2, operating on the output RO-S3_OUT switching from 0 to 1) as shown in FIG. 3 may provide advantages in terms of saving on power and area by reducing the speed requirements on the counter and the multiplier.

Further details of operating the counter 130, the multiplier 140, and the combiner 150 are described with reference to the timing diagram of FIG. 4.

As described above, the combiner 150 may be configured to combine the value of the counter signal CNT_OUT and the residue output RES_OUT to generate a digital value representative of the time period being converted by the TDC 100. In some embodiments, that digital value may be provided as a TDC output TDC_OUT. In other embodiments, optionally, the TDC 100 may further include one or more of a pulse conditioning logic 160, a saturation logic 170, a selector 180, and a calibration logic 190.

The pulse conditioning logic 160 may be configured to generate the ENABLE signal for the ring oscillator 110 and the residue generation circuit 120 based on the START signal and the STOP signal provided to the pulse conditioning logic 160. In general, the START signal and the STOP signal may be seen as two signals defining the time period to be converted to a digital value by the TDC 100. For example, in the embodiments where the TDC 100 is implemented in a PLL circuit, the START signal and the STOP signal may be a reference clock signal and a corresponding feedback clock signal, respectively, and the time period between transitions as described herein is converted to a digital value. In this context, the time duration between the transitions is sometimes referred to as the phase difference between the reference clock signal and the feedback clock signal. The pulse conditioning logic 160 may be configured to enable the TDC 100 to operate across all possible phase differences between START and STOP signals and to convert time periods to digital values irrespective of whether the START signal leads the STOP signal or the other way around. In some embodiments when the START signal leads the STOP signal, the ENABLE signal may be active (e.g., may have a voltage level corresponding to a high logic state) when the START signal is active (e.g., has a voltage level corresponding to a high logic state) and the STOP signal is inactive (e.g., has a voltage level corresponding to a low logic state). In some embodiments when the START signal lags the STOP signal, the ENABLE signal may be active when the STOP signal is active (e.g., has a voltage level corresponding to a high logic state) and the START signal is inactive (e.g., has a voltage level corresponding to a low logic state). The pulse conditioning logic 160 may further be configured to provide an indication for the TDC 100 whether the START signal leads the STOP signal or the other way around. In some embodiments, such an indication may be provided as a sign bit. The ENABLE signal may be a control signal, configured to be at a first signal level (e.g., a voltage level corresponding to a high logic state) during the time period that is being converted to the digital value and at a second signal level (e.g., a voltage level corresponding to a low logic state) outside of all time periods being converted to digital values.

In the embodiments when the pulse conditioning logic 160 is not used, the START signal and the STOP signal may be provided directly to the ring oscillator 110 and the residue generation circuit 120.

In some embodiments, the saturation logic 170 may be configured to determine whether the digital value output by the combiner 150 is greater than a saturation threshold 172 (shown in FIG. 1). Upon positive determination (i.e., when the saturation logic 170 determined that the digital value output by the combiner 150 is greater than the saturation threshold 172), the saturation logic 170 may provide as an output 174 a certain predefined digital value, e.g., the maximum digital value of the range of the TDC 100. Upon negative determination (i.e., when the saturation logic 170 determined that the digital value output by the combiner 150 is not greater than the saturation threshold 172), the saturation logic 170 may provide the digital value output by the combiner 150 as the output 174. The multiplexer 180 may then be configured to select the digital value output by the combiner 150 if the saturation logic 170 provides the same value, or, otherwise, select the value provided by the saturation logic 170 to output as the TDC_OUT.

In other embodiments, the saturation logic 170 may be configured to determine whether the digital value output by the combiner 150 is greater than the saturation threshold 172 and provide an indication of said determination in the output 174. For example, said indication may be a bit that is either set upon positive determination or not set upon negative determination. The multiplexer 180 may then be configured to select the digital value output by the combiner 150 or a certain predefined digital value (e.g., the maximum digital value of the range of the TDC 100) to output as the TDC_OUT depending on the output 174 of the saturation logic 170.

In various embodiments, the saturation threshold 172 may be either predefined or programmable (e.g., variable). Implementing the saturation logic 170 enables the TDC 100 to indicate an overflow situation and provide a code corresponding to the maximum available range of the TDC 100. In some embodiments, the output 174 of the saturation logic 170 may be provided to the pulse conditioning logic 160 (as shown in FIG. 1 with a feedback signal path from the saturation logic 170 to the pulse conditioning logic 160) and the pulse conditioning logic 160 may be configured to generate the ENABLE signal based on the output 174. For example, if the pulse conditioning logic 160 receives the output 174 that indicates that the TDC 100 reached saturation before the pulse of the STOP signal arrives (for the case when the START signal leads the STOP signal), it may be truncate the ENABLE signal, thus saving power consumed by the TDC 100.

The calibration logic 190 may be configured to perform calibration of various components of the TDC 100, e.g., to determine and compensate for part-to-part variations, e.g., variations due to fabrication processes and/or different operating conditions (e.g., voltage and temperature variations), etc. For example, in some embodiments, a test pulse may be used (e.g., during the startup of the TDC 100) and processed by the TDC 100 (in particular, by the calibration logic 190) to perform said calibration. In some embodiments, the pulse conditioning logic 160 may further be configured to allow provision of a test pulse to calibrate the TDC 100, etc. The communicative connections between the calibration logic 190 and the pulse conditioning logic 160 are shown in FIG. 1 with arrows between these two components. The test pulse may be used to condition the ENABLE signal and to calibrate for part-to-part variations.

Figure 4:
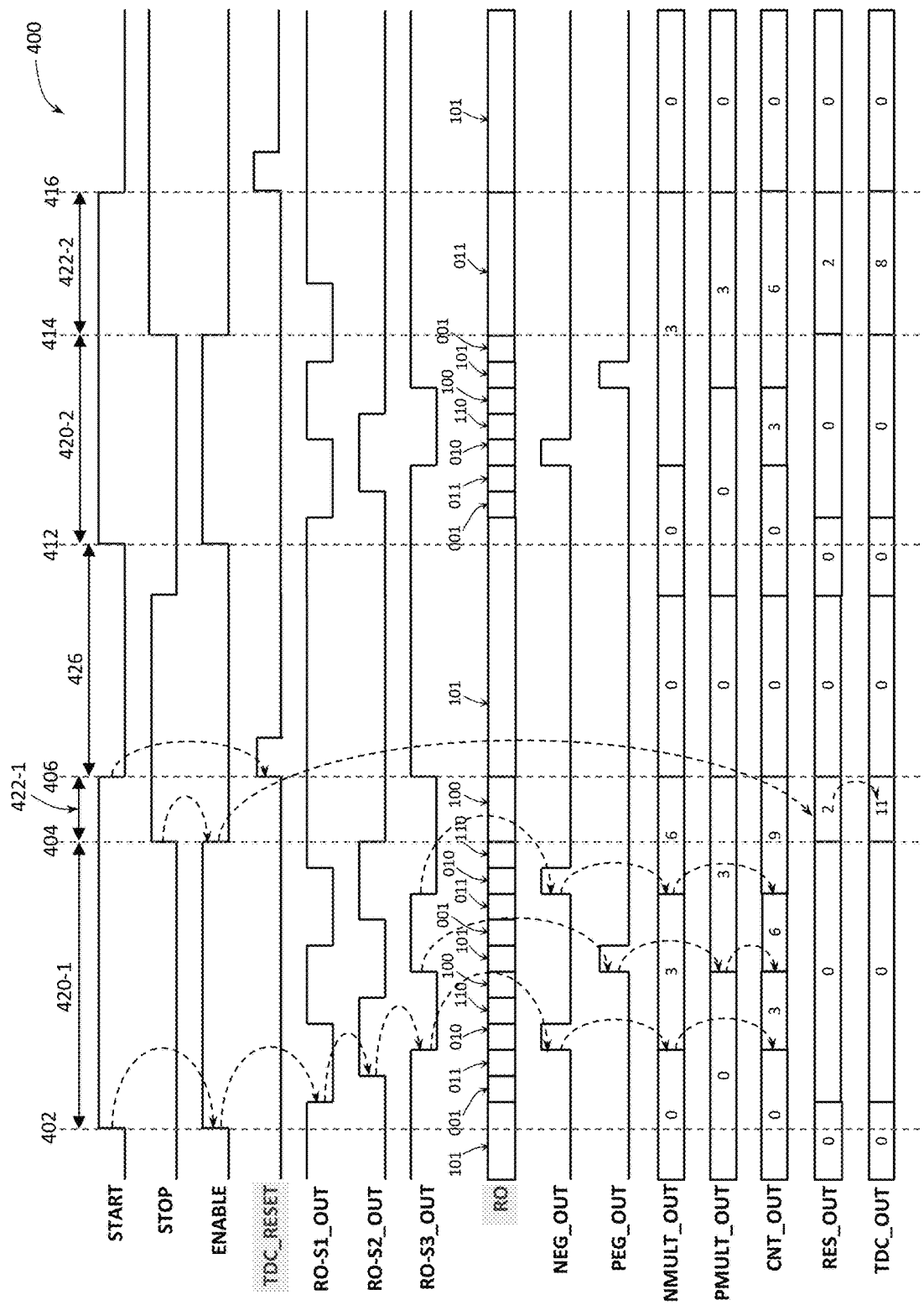
FIG. 4 provides a timing diagram for the TDC of FIG. 1, according to some embodiments of the present disclosure.

FIG. 4 provides a timing diagram 400 for the TDC of FIG. 1, according to some embodiments of the present disclosure. The timing diagram 400 illustrates various signals described above, shown in FIG. 4 one above the other, such as, starting from the top of FIG. 4, the START signal, the STOP signal, the ENABLE signal, and so on. In addition, the timing diagram 400 illustrates a TDC_RESET signal and a line RO that illustrates outputs of various stages 112 of the ring oscillator 110 at different points in time.

Various signals are illustrated in FIG. 4 as a function of time (i.e., the horizontal axis for each of the signals shown in FIG. 4 is used to count the time). It should be noted that while some signals are shown in FIG. 4 to be perfectly aligned with one another at different points in time (e.g., the rise of the START signal is shown to be perfectly aligned with the rise of the ENABLE signal), thus alignment is shown only to clarify possible dependence between the events in different signals. In other embodiments (and often times in real life implementations), there may be a certain time delay between an occurrence of one event (e.g., the rise of the START signal) that causes an occurrence of another event (e.g., the rise of the ENABLE signal). Dashed arrows are used in FIG. 4 to illustrate causation between different events. Vertical dashed lines are used in FIG. 4 to illustrate different points in time.

The timing diagram 400 provides an example of a 3-stage ring oscillator 110 (i.e., the oscillator as shown in FIG. 1), for the case when the START signal leads the STOP signal. However, explanations provided with reference to FIG. 4 and the explanations provided above with reference to FIGS. 1-3 may easily be extended to embodiments where the ring oscillator 110 includes a different number of stages and/or when the START signal lags the STOP signal, all of which embodiments being within the scope of the present disclosure.

As shown in FIG. 4, a time-to-digital conversion may begin at a time 402 when the START signal becomes high. Since this is the mode when the START signal leads the STOP signal, arrival of the START signal causes the ENABLE signal to become high. Since the ENABLE signal is provided to the ring oscillator 110, the ENABLE signal becoming high causes the start of the oscillations in the various stages 112 of the ring oscillator 110. Thus, starting from the original configuration (e.g., before the time 402) where the outputs of the stages 112 of the ring oscillator are 1, 0, and 1 (as shown in FIG. 4 with the RO being 101, i.e., the RO-S1_OUT being 1, the RO-S2_OUT being 0, and the RO-S3_OUT being 1), the ring oscillator 110 begins oscillating (as can be seen with each of the outputs RO-S1_OUT, RO-S2_OUT, and RO-S3_OUT toggling their values) and continues to oscillate until the STOP signal becomes high at a time 404, indicating the end of the first time period to be converted (the first time period being converted shown in FIG. 4 as a time period 420-1). The ENABLE signal remains high for the duration of the time period 420-1 and becomes low again after the STOP signal becomes high. The outputs RO-S1_OUT, RO-S2_OUT, and RO-S3_OUT keep toggling their respective values for the duration of the time period 420-1. In this time period, the first edge generator circuit 332-1 generates a pulse every time when the output RO-S3_OUT switches from 1 to 0 (as is shown in FIG. 4 with a first dashed arrow between RO-S3_OUT and the first pulse of NEG_OUT when RO changes from 011 to 010 and shown in FIG. 4 with a second dashed arrow between RO-S3_OUT and the second pulse of NEG_OUT when RO changes from 011 to 010 again). Similarly, the second edge generator circuit 332-2 generates a pulse every time when the output RO-S3_OUT switches from 0 to 1 (as is shown in FIG. 4 with a dashed arrow between RO-S3_OUT and the first pulse of PEG_OUT when RO changes from 100 to 101. Correspondingly, the output NMULT_OUT increases by 3 (i.e., 1 pulse of NEG_OUT multiplied by 3 because the ring oscillator 110 has 3 stages), starting from 0 for example, every time there is a pulse in the NEG_OUT while the ENABLE signal remains high for the duration of the time period 420-1, and the output PMULT_OUT increases by 3 starting from 0 for example, every time there is a pulse in the PEG_OUT while the ENABLE signal remains high for the duration of the time period 420-1. The counter output CNT_OUT then also increases by 3 every time that one of NMULT_OUT and PMULT_OUT increases.

The time 404 when the STOP signal becomes high causes several changes in the TDC 100. First, the ENABLE signal becomes low. As a result, the ring oscillator 110 stops oscillating and the residue generation circuit 120 computes the RES_OUT indicative of the residue in the outputs of the stages 112 of the ring oscillator 110 at a time period 422-1 between when the STOP signal became high and when the START signal becomes low. Because at the time when the STOP signal became high at the end of the time period 420-1 the state RO of the ring oscillator 110 was 110 (as can be seen in FIG. 4), the residue generation circuit 120 outputs the RES_OUT indicative of the decimal value of 2. This decimal value combined (e.g., added) with the decimal value of 9 of the output CNT_OUT at the time when the STOP signal became high at the end of the time period 420-1 results in the TDC output TDC_OUT being indicative of the decimal value of 11 (9+2=11). The time period 422-1 may be referred to as a TDC code update time because this is the time when the duration of the time period 420-1 is converted to a digital value, e.g., to the digital value representative of the decimal value of 11 for the example shown in FIG. 4. After the TDC code update time 422-1 (i.e., when the START signal becomes low again), the TDC 100 may be reset, as is shown in FIG. 4 with a pulse in the TDC_RESET in a time period 426 that starts at the time 406. Resetting the TDC 100 means that the outputs of the various stages 112 of the ring oscillator 110 are set back to their original values (e.g., RO is 101) and remain constant until the next time when the START signal becomes high again, which is shown in FIG. 4 to happen at a time 412), that the values of the counters and the multiplier outputs are all reset to their original values (e.g., the values of 0 as shown in FIG. 4), and the residue generation circuit 120 is reset by resetting its output to the original starting value (e.g., also the value of 0 as shown in FIG. 4). The TDC output is reset as well (e.g., also to the value of 0, as shown in FIG. 4).

After the TDC 100 has been reset in the time period 426, the ENABLE signal remains low until the next time the START signal becomes high (at the time 412), signifying the beginning of the next time period, 420-2, to be converted to the digital value and the process repeats again similar to the conversion of the time period 422-1. The times 412, 414, 416, shown in FIG. 4, and the series of events associated with these times are analogous to the times 402, 404, 406, described above and, therefore, in the interests of brevity, their descriptions are not repeated.

In various embodiments, a controller may be used to control various aspects of operating the TDC 100 as described herein. Such a controller may, e.g., be implemented as a data processing system shown in FIG. 7.

Example Systems and Devices

The TDC 100 may be implemented in various electronic devices and systems. Some examples are shown in FIGS. 5 and 6.

Figure 5:
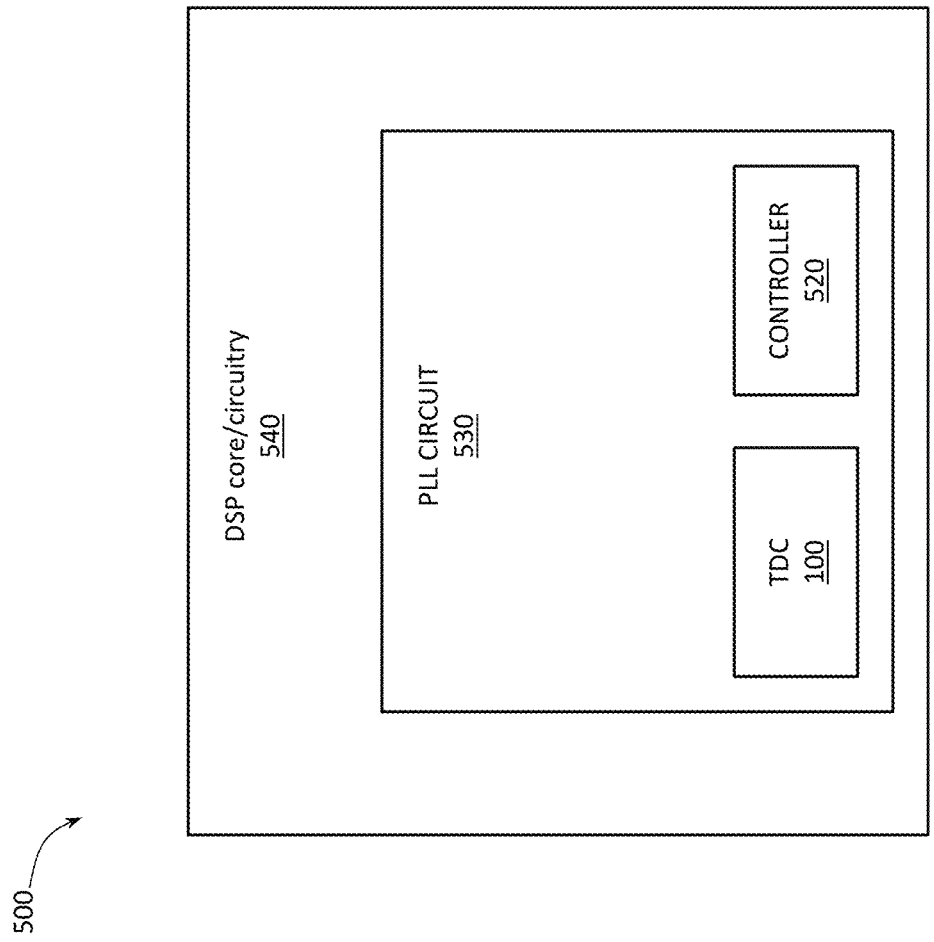
FIG. 5 provides a schematic illustration of an example system in which one or more TDCs of FIG. 1 may be implemented, according to some embodiments of the present disclosure.

FIG. 5 provides a schematic illustration of an example system in which one or more TDCs of FIG. 1 may be implemented, according to some embodiments of the present disclosure. In particular, FIG. 5 illustrates that the TDC 100 may be included as a part of, or be communicatively coupled to, a PLL circuit 530. The PLL circuit 530 may further include a controller 520, configured to control various aspects of operating the TDC 100 as described herein. The PLL 530 may be included within a device such as, e.g., a DSP core or a DSP circuitry (e.g., one or more filters, Fast Fourier Transform (FFT) accelerators, etc.) 540. When implemented in association with the PLL 530, the TDC 100 may be configured to continuously compute the phase difference between a reference clock and a feedback clock by producing a digital code. The PLL 530 may then use the TDC digital code to adjust its feedback clock to track the reference clock, and the output of the PLL 530 may be used by the DSP core/circuitry 540 as known in the art.

Figure 6:
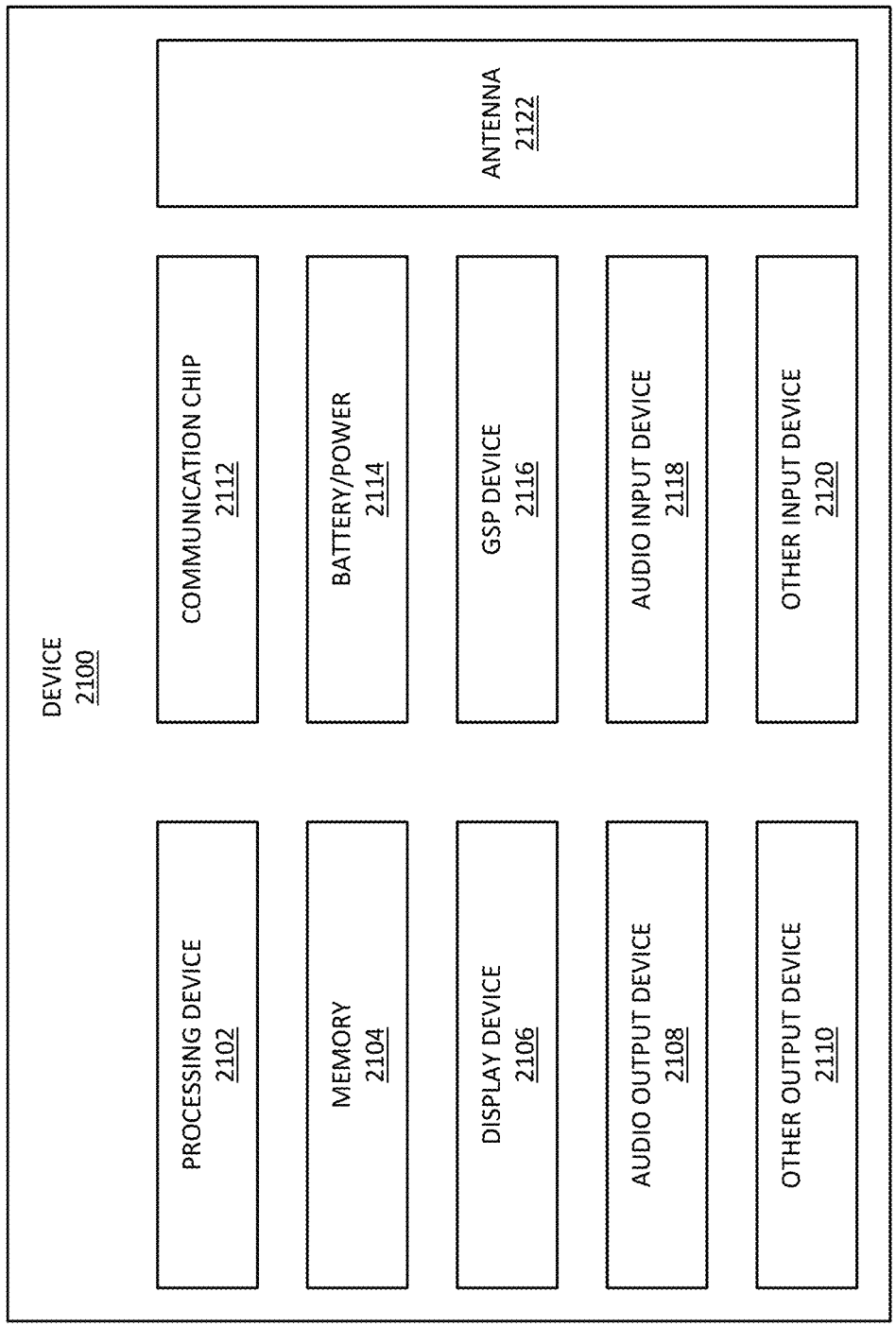
FIG. 6 is a block diagram of an example electrical device that may include one or more TDCs of FIG. 1, according to some embodiments of the present disclosure.

FIG. 6 is a block diagram of an example electrical device 2100 that may include one or more TDCs 100 with relatively low area and power, in accordance with any of the embodiments disclosed herein. For example, any suitable ones of the components of the electrical device 2100 may include one or more of the TDCs 100 disclosed herein. A number of components are illustrated in FIG. 6 as included in the electrical device 2100, but any one or more of these components may be omitted or duplicated, as suitable for the application. In some embodiments, some or all of the components included in the electrical device 2100 may be attached to one or more motherboards. In some embodiments, some or all of these components are fabricated onto a single system-on-a-chip (SoC) die.

Additionally, in various embodiments, the electrical device 2100 may not include one or more of the components illustrated in FIG. 6, but the electrical device 2100 may include interface circuitry for coupling to the one or more components. For example, the electrical device 2100 may not include a display device 2106, but may include display device interface circuitry (e.g., a connector and driver circuitry) to which a display device 2106 may be coupled. In another set of examples, the electrical device 2100 may not include an audio input device 1818 or an audio output device 2108, but may include audio input or output device interface circuitry (e.g., connectors and supporting circuitry) to which an audio input device 1818 or audio output device 2108 may be coupled.

The electrical device 2100 may include a processing device 2102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2100 may include a memory 2104, which may itself include one or more memory devices such as volatile memory (e.g., dynamic RAM (DRAM)), nonvolatile memory (e.g., read-only memory (ROM)), flash memory, solid state memory, and/or a hard drive. In some embodiments, the memory 2104 may include memory that shares a die with the processing device 2102. This memory may be used as cache memory and may include embedded DRAM (eDRAM) or spin transfer torque magnetic RAM (STT-MRAM).

In some embodiments, the electrical device 2100 may include a communication chip 2112 (e.g., one or more communication chips). For example, the communication chip 2112 may be configured for managing wireless communications for the transfer of data to and from the electrical device 2100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2112 may operate in accordance with other wireless protocols in other embodiments. The electrical device 2100 may include an antenna 2122 to facilitate wireless communications and/or to receive other wireless communications (such as AM or FM radio transmissions).

In some embodiments, the communication chip 2112 may manage wired communications, such as electrical, optical, or any other suitable communication protocols (e.g., the Ethernet). As noted above, the communication chip 2112 may include multiple communication chips. For instance, a first communication chip 2112 may be dedicated to shorter-range wireless communications such as Wi-Fi or Bluetooth, and a second communication chip 2112 may be dedicated to longer-range wireless communications such as global positioning system (GPS), EDGE, GPRS, CDMA, WiMAX, LTE, EV-DO, or others. In some embodiments, a first communication chip 2112 may be dedicated to wireless communications, and a second communication chip 2112 may be dedicated to wired communications.

The electrical device 2100 may include battery/power circuitry 2114. The battery/power circuitry 2114 may include one or more energy storage devices (e.g., batteries or capacitors) and/or circuitry for coupling components of the electrical device 2100 to an energy source separate from the electrical device 2100 (e.g., AC line power).

The electrical device 2100 may include a display device 2106 (or corresponding interface circuitry, as discussed above). The display device 2106 may include any visual indicators, such as a heads-up display, a computer monitor, a projector, a touchscreen display, a liquid crystal display (LCD), a light-emitting diode display, or a flat panel display.

The electrical device 2100 may include an audio output device 2108 (or corresponding interface circuitry, as discussed above). The audio output device 2108 may include any device that generates an audible indicator, such as speakers, headsets, or earbuds.

The electrical device 2100 may include an audio input device 2118 (or corresponding interface circuitry, as discussed above). The audio input device 2118 may include any device that generates a signal representative of a sound, such as microphones, microphone arrays, or digital instruments (e.g., instruments having a musical instrument digital interface (MIDI) output).

The electrical device 2100 may include a GPS device 2116 (or corresponding interface circuitry, as discussed above). The GPS device 2116 may be in communication with a satellite-based system and may receive a location of the electrical device 2100, as known in the art.

The electrical device 2100 may include another output device 2110 (or corresponding interface circuitry, as discussed above). Examples of the other output device 2110 may include an audio codec, a video codec, a printer, a wired or wireless transmitter for providing information to other devices, or an additional storage device.

The electrical device 2100 may include another input device 2120 (or corresponding interface circuitry, as discussed above). Examples of the other input device 2120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2100 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 2100 may be any other electronic device that processes data.

Example Data Processing System

Figure 7:
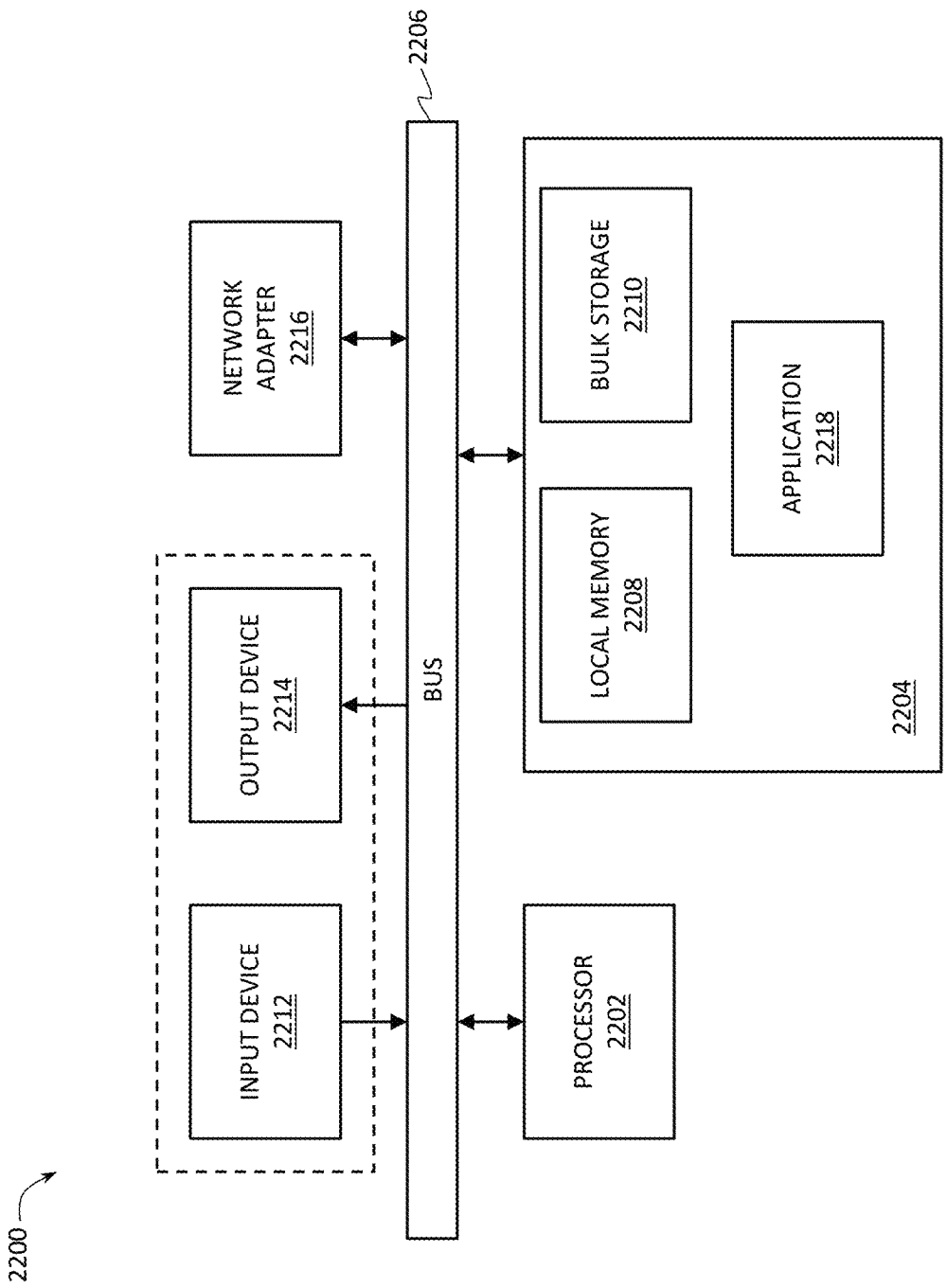
FIG. 7 provides a block diagram illustrating an example data processing system that may be configured to control operation of one or more TDCs of FIG. 1, according to some embodiments of the present disclosure.

FIG. 7 provides a block diagram illustrating an example data processing system 2200 that may be configured to control operation of one or more TDCs with relatively low area and power, according to some embodiments of the present disclosure. For example, the data processing system 2200 may be configured to implement or control portions of the TDC 100, or any further embodiments of the TDCs with relatively low area and power, described herein. In another example, the data processing system 2200 may be configured to implement at least portions of the controller 520 or any other controller configured to control various aspects of operating the TDC 100 as described herein.

As shown in FIG. 7, the data processing system 2200 may include at least one processor 2202, e.g., a hardware processor 2202, coupled to memory elements 2204 through a system bus 2206. As such, the data processing system may store program code within memory elements 2204. Further, the processor 2202 may execute the program code accessed from the memory elements 2204 via a system bus 2206. In one aspect, the data processing system may be implemented as a computer that is suitable for storing and/or executing program code. It should be appreciated, however, that the data processing system 2200 may be implemented in the form of any system including a processor and a memory that is capable of performing the functions described within this disclosure.

In some embodiments, the processor 2202 can execute software or an algorithm to perform the activities as discussed in the present disclosure, in particular activities related to TDCs with relatively low area and power, as described herein. The processor 2202 may include any combination of hardware, software, or firmware providing programmable logic, including by way of non-limiting example a microprocessor, a digital signal processor (DSP), a field-programmable gate array (FPGA), a programmable logic array (PLA), an application specific IC (ASIC), or a virtual machine processor. The processor 2202 may be communicatively coupled to the memory element 2204, for example in a direct-memory access (DMA) configuration, so that the processor 2202 may read from or write to the memory elements 2204.

In general, the memory elements 2204 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2200 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements of the TDC 100, shown in FIGS. 1-3, can also include suitable interfaces for receiving, transmitting, and/or otherwise communicating data or information in a network environment so that they can communicate with, e.g., the data processing system 2200.

In certain example implementations, mechanisms for implementing one or more TDCs with relatively low area and power as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as the memory elements 2204 shown in FIG. 7, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as the processor 2202 shown in FIG. 7, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2204 may include one or more physical memory devices such as, for example, local memory 2208 and one or more bulk storage devices 2210. The local memory may refer to RAM or other non-persistent memory device(s) generally used during actual execution of the program code. A bulk storage device may be implemented as a hard drive or other persistent data storage device. The processing system 2200 may also include one or more cache memories (not shown) that provide temporary storage of at least some program code in order to reduce the number of times program code must be retrieved from the bulk storage device 2210 during execution.

As shown in FIG. 7, the memory elements 2204 may store an application 2218. In various embodiments, the application 2218 may be stored in the local memory 2208, the one or more bulk storage devices 2210, or apart from the local memory and the bulk storage devices. It should be appreciated that the data processing system 2200 may further execute an operating system (not shown in FIG. 7) that can facilitate execution of the application 2218. The application 2218, being implemented in the form of executable program code, can be executed by the data processing system 2200, e.g., by the processor 2202. Responsive to executing the application, the data processing system 2200 may be configured to perform one or more operations or method steps described herein.

Input/output (I/O) devices depicted as an input device 2212 and an output device 2214, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2214 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2214. Input and/or output devices 2212, 2214 may be coupled to the data processing system either directly or through intervening I/O controllers.

In an embodiment, the input and the output devices may be implemented as a combined input/output device (illustrated in FIG. 7 with a dashed line surrounding the input device 2212 and the output device 2214). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 2216 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2200, and a data transmitter for transmitting data from the data processing system 2200 to said systems, devices and/or networks. Modems, cable modems, and Ethernet cards are examples of different types of network adapter that may be used with the data processing system 2200.

SELECT EXAMPLES

The following paragraphs provide various examples of the embodiments disclosed herein.

Example 1 provides a TDC that includes a ring oscillator (110), including a plurality of stages (e.g., an odd number of 3 or more stages); a residue generation circuit (120), where a number of stages of the residue generation circuit is equal to a number of stages of the ring oscillator, and where each stage of the residue generation circuit is configured to operate on outputs from two different stages of the ring oscillator; a counter (130), coupled to an output of one of the plurality of stages of the ring oscillator and configured to count a number of times that a signal at the output of one of the plurality of stages of the ring oscillator switches between being at a first signal level (e.g., a voltage level corresponding to a logic state HIGH) and being at a second signal level (e.g., a voltage level corresponding to a logic state LOW) (e.g., counts the number of times the output of that stage of the ring oscillator switches from 0 to 1 or from 1 to 0) during a time period that is being converted to a digital value (e.g., during the time period that an ENABLE signal for the ring oscillator and the residue generation circuit is in a first logic state (e.g., a logic state HIGH)); and a combiner (150), configured to combine a value indicative of the number of times counted by the counter and an output of the residue generation circuit (e.g., when the ENABLE signal for the ring oscillator and the residue generation circuit switches to a second logic state (e.g., a logic state LOW)) to generate the digital value representative of the time period. In such a TDC, the counter may operate on only one of the ring oscillator outputs (e.g., on the output of the last stage of the ring oscillator as shown in the present drawings although in other embodiments the counter may operate on an output of any other ring oscillator stages), which advantageously allows keeping the size of the counter relatively small, while the residue generation circuit is used to provide a code corresponding to the state of the ring oscillator as the enable signal for the ring oscillator and the residue generation circuit switches to the second logic state.

Example 2 provides the TDC according to example 1, where the value indicative of the number of times counted by the counter is based on (e.g., is equal to) the number of times counted by the counter multiplied, using a multiplier (140), by a value indicative of (e.g., equal to) the number of stages of the ring oscillator.

Example 3 provides the TDC according to examples 1 or 2, where the counter includes a first edge generator and a second edge generator, the first edge generator is configured to generate a first indication when the signal at the output of one of the plurality of stages of the ring oscillator switches from being at the first signal level (e.g., a voltage level corresponding to a logic state HIGH) to being at the second signal level (e.g., a voltage level corresponding to a logic state LOW), the second edge generator is configured to generate a second indication when the signal at the output of one of the plurality of stages of the ring oscillator switches from being at the second signal level (e.g., a voltage level corresponding to a logic state LOW) to being at the first signal level (e.g., a voltage level corresponding to a logic state HIGH), and the number of times counted by the counter is a sum of a number of times the first edge generator generated the first indication and a number of times the second edge generator generated the second indication during the time period that is being converted to the digital value.

Example 4 provides the TDC according to example 3, where the counter further includes a first multiplier, a second multiplier, and an adder. In such a TDC, the first multiplier is configured to generate a first multiplier output by multiplying a value indicative of (e.g., equal to) the number of stages of the ring oscillator and the number of times the first edge generator generated the first indication during the time period that is being converted to the digital value, the second multiplier is configured to generate a second multiplier output by multiplying the value indicative of (e.g., equal to) the number of stages of the ring oscillator and the number of times the second edge generator generated the second indication during the time period that is being converted to the digital value, the adder is configured to generate an adder output by adding the first multiplier output and the second multiplier output, and the value indicative of the number of times counted by the counter is based (e.g., is equal to) on the adder output.

Example 5 provides the TDC according to any one of the preceding examples, where the counter is configured to be reset (i.e., the value of the counter is configured to be set to a certain reset value (e.g., to zero)) after the digital value has been generated and before a conversion of another time period has begun.

Example 6 provides the TDC according to any one of the preceding examples, where the residue generation circuit is configured to be reset (i.e., the output of the residue generation circuit is configured to be set to a certain reset value (e.g., to zero)) after the digital value has been generated and before a conversion of another time period has begun.

Example 7 provides the TDC according to any one of the preceding examples, where the ring oscillator is configured to be reset (i.e., the outputs of the plurality of stages of the ring oscillator are configured to be set to their respective reset values (e.g., to 1, 0, 1 for the example of a 3-stage ring oscillator)) after the digital value has been generated and before a conversion of another time period has begun.

Example 8 provides the TDC according to any one of the preceding examples, where a first stage of the residue generation circuit is configured to operate on an output of a first stage of the ring oscillator and an output of a last stage of the ring oscillator, and a second stage of the residue generation circuit is configured to operate on the output of the first stage of the ring oscillator and an output of a second stage of the ring oscillator.

Example 9 provides the TDC according to any one of the preceding examples, where a last stage of the residue generation circuit is configured to operate on an output of a one before last stage of the ring oscillator and an output of a last stage of the ring oscillator.

Example 10 provides the TDC according to any one of the preceding examples, where each stage of the residue generation circuit includes a respective (i.e., a different instance of) logic circuit having a response of an exclusive OR (XOR) gate.

Example 11 provides the TDC according to example 10, where the TDC further includes a respective (i.e., a different instance of) latch circuit corresponding to each stage of the ring oscillator, each latch circuit having an input configured to receive a signal indicative of an output of the respective stage of the ring oscillator corresponding to the latch circuit, and further having an output coupled to the logic circuit of the respective stage of the residue generation circuit.

Example 12 provides the TDC according to example 11, where at least one of the latch circuits has a further input configured to receive a control signal configured to enable the residue generation circuit to generate the output of the residue generation circuit once the time period being converted to the digital value has ended and before the residue generation circuit is reset for a conversion of another time period. For example, such a control signal may be an ENABLE signal, where the ENABLE signal may be configured to be at a first signal level (e.g., a voltage level corresponding to a logic state HIGH) during the time period that is being converted to the digital value and at a second signal level (e.g., a voltage level corresponding to a logic state LOW) outside of all time periods being converted to digital values.

Example 13 provides the TDC according to any one of the preceding examples, where each stage of the ring oscillator includes a respective (i.e., a different instance of) logic circuit having a response of a NOT gate (in other words, each stage of the ring oscillator includes a digital inverter).

Example 14 provides the TDC according to any one of the preceding examples, further including a pulse conditioning logic, configured to generate an enable signal for the ring oscillator and the residue generation circuit such that, if a start signal leads a stop signal, the enable signal is active (e.g., has a voltage level corresponding to a logic state HIGH) when the start signal is active (e.g., has a voltage level corresponding to a logic state HIGH) and the stop signal is inactive (e.g., has a voltage level corresponding to a logic state LOW), and, if the start signal lags the stop signal, the enable signal is active when the stop signal is active (e.g., has a voltage level corresponding to a logic state HIGH) and the start signal is inactive (e.g., has a voltage level corresponding to a logic state LOW). The pulse conditioning logic may further be conditioned to provide an indication for the TDC whether the start signal leads the stop signal or the other way around, allow provision of a test pulse to calibrate the TDC, etc.

Example 15 provides the TDC according to any one of the preceding examples, further including a saturation logic, configured to determine whether the digital value is greater than a saturation threshold value and, upon positive determination, set the digital value to a predefined value.

Example 16 provides an electronic device that includes a TDC, configured to convert a time period indicative of a phase difference between a reference clock signal and an input clock signal to a digital value, and further includes a PLL circuit, configured to generate an output signal having a phase related to a phase of the input clock signal by being based on the digital value generated by the TDC. In such an electronic device, the TDC includes a ring oscillator (110), including a plurality of stages (e.g., an odd number of 3 or more stages), a residue generation circuit (120), where a number of stages of the residue generation circuit is equal to a number of stages of the ring oscillator, and where each stage of the residue generation circuit is configured to operate on outputs from two different stages of the ring oscillator, and a combiner (150), configured to generate the digital value based on an output of the residue generation circuit.

Example 17 provides the electronic device according to example 16, where the electronic device is a digital signal processing core or a digital signal processing circuitry.

Example 18 provides the electronic device according to examples 16 or 17, where the TDC is a TDC according to any one of the preceding examples.

Example 19 provides a method for converting a time period indicative of a phase difference between a reference clock signal and an input clock signal to a digital value. The method includes providing, by a pulse conditioning logic, an enable signal to each of a ring oscillator and a residue generation circuit, where the enable signal is active (e.g., has a voltage level corresponding to a logic state HIGH) for the duration of the time period and is inactive (e.g., has a voltage level corresponding to a logic state LOW) immediately before and immediately after the time period, the ring oscillator includes a plurality of stages (e.g., an odd number of 3 or more stages), a number of stages of the residue generation circuit is equal to a number of stages of the ring oscillator, and each stage of the residue generation circuit is configured to operate on outputs from two different stages of the ring oscillator. The method further includes counting, by a counter, a number of times that a signal at an output of one of the plurality of stages of the ring oscillator switches between being at a first signal level (e.g., a voltage level corresponding to a logic state HIGH) and being at a second signal level (e.g., a voltage level corresponding to a logic state LOW) (e.g., counting the number of times the output of that stage of the ring oscillator switches from 0 to 1 or from 1 to 0) in a time when the enable signal is active. The method also includes generating the digital value based on a value indicative of the number of times counted by the counter and an output of the residue generation circuit.

Example 20 provides the method according to example 19, further including multiplying, by one or more multipliers, the number of times counted by the counter by a value indicative of (e.g., equal to) the number of stages of the ring oscillator, where the digital value is generated based on a value indicative of the multiplying.

Example 21 provides the method according to examples 19 or 20, further including generating, by a PLL circuit, an output signal having a phase related to a phase of the input clock signal by generating the output signal based on the digital value.

Example 22 provides the method according to any one of examples 19-21, where the method is performed by a TDC according to any one of the preceding examples.

Example 23 provides the method according to any one of examples 19-22, where the method further includes steps for controlling or operating a TDC according to any one of the preceding examples.

Example 24 provides a non-transitory computer-readable storage medium including instructions for execution which, when executed by a processor, are operable to perform operations of the method according to any one of examples 19-23.

VARIATIONS AND IMPLEMENTATIONS

While embodiments of the present disclosure were described above with references to exemplary implementations as shown in FIGS. 1-7, a person skilled in the art will realize that the various teachings described above are applicable to a large variety of other implementations.

In the discussions of the embodiments above, components of a system, such as counters, logic elements (e.g., XOR gates), and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to implementing one or more TDCs with relatively low area and power.

Parts of various systems for implementing one or more TDCs with relatively low area and power as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In some embodiments, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

All of the specifications, dimensions, and relationships outlined herein (e.g., the number of components of the TDCs with relatively low area and power, or portions thereof, shown in the present drawings, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

Furthermore, functions related to implementing one or more TDCs with relatively low area and power as proposed herein illustrate only some of the possible functions that may be executed by, or within, system illustrated in the present figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

The invention claimed is:

1. A time-to-digital converter (TDC), comprising:
a ring oscillator, having a plurality of stages;
a residue generation circuit, having a plurality of stages, where a stage of the residue generation circuit is configured to operate on outputs from two stages of the ring oscillator;
a counter, coupled to an output of one of the plurality of stages of the ring oscillator and configured to count a number of times that a signal at the output of the one of the plurality of stages of the ring oscillator switches from being at a first signal level to being at a second signal level and from being at the second signal level to being at the first signal level during a time period that is being converted to a digital value; and
a combiner, configured to combine a value indicative of the number of times counted by the counter and an output of the residue generation circuit to generate the digital value.

2. The TDC according to claim 1, wherein the value indicative of the number of times counted by the counter is based on the number of times counted by the counter multiplied by a value indicative of the number of stages of the ring oscillator.

3. The TDC according to claim 1, wherein:
the counter includes a first edge generator and a second edge generator,
the first edge generator is configured to generate a first indication when the signal at the output of one of the plurality of stages of the ring oscillator switches from being at the first signal level to being at the second signal level,
the second edge generator is configured to generate a second indication when the signal at the output of one of the plurality of stages of the ring oscillator switches from being at the second signal level to being at the first signal level, and
the number of times counted by the counter is a sum of a number of times the first edge generator generated the first indication and a number of times the second edge generator generated the second indication during the time period that is being converted to the digital value.

4. The TDC according to claim 3, wherein:
the counter further includes a first multiplier, a second multiplier, and an adder,
the first multiplier is configured to generate a first multiplier output by multiplying a value indicative of the number of stages of the ring oscillator and the number of times the first edge generator generated the first indication during the time period that is being converted to the digital value,
the second multiplier is configured to generate a second multiplier output by multiplying the value indicative of the number of stages of the ring oscillator and the number of times the second edge generator generated the second indication during the time period that is being converted to the digital value,
the adder is configured to generate an adder output by adding the first multiplier output and the second multiplier output, and
the value indicative of the number of times counted by the counter is based on the adder output.

5. The TDC according to claim 1, wherein at least one of the counter, the residue generation circuit, and the ring oscillator is configured to be reset after the digital value has been generated and before a conversion of another time period has begun.

6. The TDC according to claim 1, wherein:
a first stage of the residue generation circuit is configured to operate on an output of a first stage of the ring oscillator and an output of a last stage of the ring oscillator, and
a second stage of the residue generation circuit is configured to operate on the output of the first stage of the ring oscillator and an output of a second stage of the ring oscillator.

7. The TDC according to claim 1, wherein a last stage of the residue generation circuit is configured to operate on outputs of last two stages of the ring oscillator.

8. The TDC according to claim 1, wherein each stage of the residue generation circuit includes a logic circuit having a response of an exclusive OR (XOR) gate.

9. The TDC according to claim 8, wherein the TDC further includes a respective latch circuit corresponding to each stage of the ring oscillator, each latch circuit having an input configured to receive a signal indicative of an output of the stage of the ring oscillator corresponding to the latch circuit, and further having an output coupled to the logic circuit of the respective stage of the residue generation circuit.

10. The TDC according to claim 9, wherein at least one of the latch circuits has a further input configured to receive a control signal configured to enable the residue generation circuit to generate the output of the residue generation circuit once the time period being converted to the digital value has ended and before the residue generation circuit is reset for a conversion of another time period.

11. The TDC according to claim 1, further comprising a pulse conditioning logic, configured to generate an enable signal for the ring oscillator and the residue generation circuit such that:
if a start signal leads a stop signal, the enable signal is active when the start signal is active and the stop signal is inactive, and
if the start signal lags the stop signal, the enable signal is active when the stop signal is active and the start signal is inactive.

12. The TDC according to claim 1, further comprising a saturation logic, configured to determine whether the digital value is greater than a saturation threshold value and, upon positive determination, set the digital value to a predefined value.

13. An electronic device, comprising:
a time-to-digital converter (TDC), configured to convert a time period indicative of a phase difference between a reference clock signal and an input clock signal to a digital value; and
a phase-locked loop (PLL) circuit, configured to generate an output signal having a phase related to a phase of the input clock signal by being based on the digital value generated by the TDC,
wherein the TDC includes:
a ring oscillator, comprising a plurality of stages,
a residue generation circuit, comprising a plurality of stages, where each stage of the residue generation circuit is configured to operate on outputs from two stages of the ring oscillator, and
a combiner, configured to generate the digital value based on an output of the residue generation circuit.

14. The electronic device according to claim 13, wherein the electronic device is a digital signal processing core or a digital signal processing circuitry.

15. A time-to-digital converter (TDC), configured to convert a time period to a digital value, the TDC comprising:
a ring oscillator, having a plurality of stages;
a residue generation circuit, having a plurality of stages, where a stage of the residue generation circuit is configured to operate on outputs from two stages of the ring oscillator;
a counter, coupled to an output of one of the plurality of stages of the ring oscillator and configured to count a number of times that a signal at the output of the one of the plurality of stages of the ring oscillator switches between being at a first signal level and being at a second signal level during the time period; and
a combiner, configured to generate a digital value based on the number of times counted by the counter.

16. The TDC according to claim 15, wherein a last stage of the residue generation circuit is configured to operate outputs from last two stages of the ring oscillator.

17. The TDC according to claim 15, wherein:
a first stage of the residue generation circuit is configured to operate on an output of a first stage of the ring oscillator and an output of a last stage of the ring oscillator, and
a second stage of the residue generation circuit is configured to operate on the output of the first stage of the ring oscillator and an output of a second stage of the ring oscillator.

18. The TDC according to claim 15, wherein the combiner is configured to generate the digital value based on the number of times counted by the counter multiplied by a value indicative of the number of stages of the ring oscillator.

19. The TDC according to claim 15, wherein at least one stage of the residue generation circuit includes a logic circuit having a response of an exclusive OR (XOR) gate.

20. The TDC according to claim 15, further comprising a pulse conditioning logic, configured to generate an enable signal for the ring oscillator and the residue generation circuit such that:
if a start signal leads a stop signal, the enable signal is active when the start signal is active and the stop signal is inactive, and
if the start signal lags the stop signal, the enable signal is active when the stop signal is active and the start signal is inactive.

21. The TDC according to claim 1, wherein the counter is configured to be reset after the digital value has been generated and before a conversion of another time period has begun.

22. The TDC according to claim 1, wherein the residue generation circuit is configured to be reset after the digital value has been generated and before a conversion of another time period has begun.

23. The TDC according to claim 1, wherein each stage of the ring oscillator includes a logic circuit having a response of a NOT gate.

24. A method for converting a time period indicative of a phase difference between a reference clock signal and an input clock signal to a digital value, the method comprising:
providing, by a pulse conditioning logic, an enable signal to each of a ring oscillator and a residue generation circuit, where:
the enable signal is active for the duration of the time period and is inactive before and after the time period,
the ring oscillator includes a plurality of stages,
the residue generation circuit includes a plurality of stages, and each stage of the residue generation circuit is configured to operate on outputs from two stages of the ring oscillator;
counting, by a counter, a number of times that a signal at an output of one of the plurality of stages of the ring oscillator switches between being at a first signal level and being at a second signal level in a time when the enable signal is active; and
generating the digital value based on a value indicative of the number of times counted by the counter and an output of the residue generation circuit.

25. The method according to claim 24, further comprising multiplying, by one or more multipliers, the number of times counted by the counter by a value indicative of the number of stages of the ring oscillator, where the digital value is generated based on a value indicative of the multiplying.

26. The method according to claim 24, further comprising generating, by a phase-locked loop (PLL) circuit, an output signal having a phase related to a phase of the input clock signal by generating the output signal based on the digital value.

* * * * *